United States Patent
Fuergut et al.

(10) Patent No.: US 10,373,895 B2
(45) Date of Patent: Aug. 6, 2019

(54) SEMICONDUCTOR DEVICE HAVING DIE PADS WITH EXPOSED SURFACES

(71) Applicant: Infineon Technologies Austria AG, Villach (AT)

(72) Inventors: Edward Fuergut, Dasing (DE); Martin Gruber, Schwandorf (DE); Wolfgang Scholz, Olching (DE); Ralf Otremba, Kaufbeuren (DE)

(73) Assignee: Infineon Technologies Austria AG, Villach (AT)

( * ) Notice: Subject to any disclaimer, the term of this patent is extended or adjusted under 35 U.S.C. 154(b) by 121 days.

(21) Appl. No.: 15/375,812

(22) Filed: Dec. 12, 2016

(65) Prior Publication Data
US 2018/0166366 A1    Jun. 14, 2018

(51) Int. Cl.
*H01L 23/495* (2006.01)
*H01L 21/48* (2006.01)
(Continued)

(52) U.S. Cl.
CPC .... *H01L 23/49537* (2013.01); *H01L 21/4825* (2013.01); *H01L 21/4842* (2013.01); *H01L 21/4882* (2013.01); *H01L 21/52* (2013.01); *H01L 21/56* (2013.01); *H01L 23/3114* (2013.01); *H01L 23/4952* (2013.01); *H01L 23/49562* (2013.01); *H01L 23/49575* (2013.01);
(Continued)

(58) Field of Classification Search
CPC ........... H01L 23/49537; H01L 23/3114; H01L 25/4952; H01L 23/49575; H01L 21/4825; H01L 21/4842; H01L 21/56; H01L 21/4882; H01L 2225/06589; H01L 2225/06555; H01L 2225/06544; H01L 2225/0651; H01L 2225/06506
USPC ....... 257/666, 696, 698, 712, 713, 717, 721, 257/675, 684.777, 686, 685, 723
See application file for complete search history.

(56) References Cited

U.S. PATENT DOCUMENTS 5,917,242 A     6/1999  Ball
6,208,020 B1 *  3/2001  Minamio ............. H01L 21/565
                                                    257/675
(Continued)

FOREIGN PATENT DOCUMENTS

EP    1 329 951 A2    7/2003
EP    1 696 484 A1    8/2006
EP    3 007 227 A1    4/2016

*Primary Examiner* — Alexander Oscar Williams
(74) *Attorney, Agent, or Firm* — Dicke, Billig & Czaja, PLLC

(57) ABSTRACT

A semiconductor device includes a first lead frame, a second lead frame, a first semiconductor chip, and an encapsulation material. The first lead frame includes a first die pad having a first surface and a second surface opposite to the first surface. The second lead frame includes a second die pad having a first surface and a second surface opposite to the first surface. The first surface of the second die pad faces the first surface of the first die pad. The first semiconductor chip is attached to the first surface of the first die pad. The encapsulation material encapsulates the first semiconductor chip and portions of the first lead frame and the second lead frame. The encapsulation material has a first surface aligned with the second surface of the first die pad and a second surface aligned with the second surface of the second die pad.

20 Claims, 16 Drawing Sheets

(51) Int. Cl.
*H01L 21/52* (2006.01)
*H01L 23/31* (2006.01)
*H01L 25/065* (2006.01)
*H01L 21/56* (2006.01)

(52) U.S. Cl.
CPC ........ *H01L 25/0652* (2013.01); *H01L 21/561* (2013.01); *H01L 23/3107* (2013.01); *H01L 2224/0603* (2013.01); *H01L 2224/48472* (2013.01); *H01L 2224/4903* (2013.01); *H01L 2224/49111* (2013.01); *H01L 2224/97* (2013.01); *H01L 2225/0651* (2013.01); *H01L 2225/06506* (2013.01); *H01L 2225/06544* (2013.01); *H01L 2225/06555* (2013.01); *H01L 2225/06589* (2013.01)

(56) References Cited

U.S. PATENT DOCUMENTS

| | | | |
|---|---|---|---|
| 6,518,659 B1* | 2/2003 | Glenn | H01L 23/043 257/686 |
| 6,545,345 B1* | 4/2003 | Glenn | H01L 23/5389 257/676 |
| 9,263,563 B2 | 2/2016 | Otremba et al. | |
| 2003/0092205 A1* | 5/2003 | Wu | H01L 23/3107 438/15 |
| 2003/0122239 A1* | 7/2003 | Song | H01L 23/4951 257/686 |
| 2005/0110127 A1* | 5/2005 | Kanemoto | H01L 23/49575 257/686 |
| 2007/0096276 A1 | 5/2007 | Huang | |
| 2007/0096284 A1* | 5/2007 | Wallace | H01L 23/49506 257/686 |
| 2008/0061413 A1* | 3/2008 | Otremba | H01L 21/565 257/676 |
| 2008/0150106 A1* | 6/2008 | Pang Kuah | H01L 23/4334 257/676 |
| 2008/0315381 A1* | 12/2008 | Yoshida | H01L 23/49503 257/676 |
| 2009/0001535 A1* | 1/2009 | Heng | H01L 21/565 257/676 |
| 2009/0072413 A1* | 3/2009 | Mahler | H01L 21/6835 257/777 |
| 2009/0115038 A1* | 5/2009 | Son | H01L 21/565 257/675 |
| 2009/0127681 A1* | 5/2009 | Son | H01L 21/565 257/675 |
| 2009/0215230 A1* | 8/2009 | Muto | H01L 21/565 438/124 |
| 2010/0193920 A1* | 8/2010 | Poh | H01L 21/565 257/676 |
| 2011/0049693 A1 | 3/2011 | Nakashiba et al. | |
| 2011/0260266 A1* | 10/2011 | Han | G01L 19/0084 257/415 |
| 2012/0032316 A1* | 2/2012 | Nishikawa | H01L 21/565 257/676 |
| 2012/0038033 A1* | 2/2012 | Oga | H01L 21/565 257/659 |
| 2012/0038034 A1* | 2/2012 | Shin | H01L 25/16 257/676 |
| 2012/0228696 A1* | 9/2012 | Carpenter | H01L 23/49575 257/329 |
| 2013/0009295 A1* | 1/2013 | Otremba | H01L 23/49524 257/676 |
| 2013/0200502 A1* | 8/2013 | Nikitin | H01L 24/82 257/666 |
| 2013/0200532 A1* | 8/2013 | Otremba | H01L 23/49524 257/779 |
| 2013/0256852 A1* | 10/2013 | Wyant | H01L 23/49562 257/670 |
| 2013/0270689 A1 | 10/2013 | Kim et al. | |
| 2013/0270706 A1 | 10/2013 | Sugimura et al. | |
| 2014/0061884 A1* | 3/2014 | Carpenter | H01L 23/4952 257/676 |
| 2014/0264383 A1* | 9/2014 | Kajiwara | H01L 21/50 257/77 |
| 2015/0214138 A1* | 7/2015 | Takagi | H01L 23/28 257/675 |
| 2015/0214139 A1* | 7/2015 | Miyakawa | H01L 23/28 257/675 |
| 2015/0325559 A1* | 11/2015 | Niu | H01L 21/76802 257/675 |
| 2016/0141229 A1* | 5/2016 | Paek | H01L 24/32 257/673 |
| 2016/0358838 A1* | 12/2016 | Basler | H01L 24/48 |
| 2016/0358890 A1* | 12/2016 | Heinrich | H01L 24/16 |
| 2017/0125881 A1* | 5/2017 | Mangrum | H01Q 1/2283 |

\* cited by examiner

SEMICONDUCTOR DEVICE HAVING DIE PADS WITH EXPOSED SURFACES

BACKGROUND

Discrete package semiconductor devices may have a lead frame including an exposed die pad to enable single-sided cooling of the devices. The power density and thus functionality of the semiconductor devices is limited by the cooling capability of the semiconductor devices.

For these and other reasons, there is a need for the present invention.

SUMMARY

One example of a semiconductor device includes a first lead frame, a second lead frame, a first semiconductor chip, and an encapsulation material. The first lead frame includes a first die pad having a first surface and a second surface opposite to the first surface of the first die pad. The second lead frame includes a second die pad having a first surface and a second surface opposite to the first surface of the second die pad. The first surface of the second die pad faces the first surface of the first die pad. The first semiconductor chip is attached to the first surface of the first die pad. The encapsulation material encapsulates the first semiconductor chip and portions of the first lead frame and the second lead frame. The encapsulation material has a first surface aligned with the second surface of the first die pad and a second surface aligned with the second surface of the second die pad.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

Disclosed herein are semiconductor devices including multiple die pads in which at least two of the die pads are located on different surfaces of the packages such that the at least two die pads are exposed. The semiconductor devices may have through-hole packages, dual inline packages (DIPs), power module packages, surface mount technology (SMT) packages (e.g., leaded or leadless with external contact leads or pads on both package sides), or other suitable packages. The at least two exposed die pads enable double-sided cooling of the semiconductor devices. The double-sided cooling enables increased power density by doubling the useable chip area compared to a similar sized package having only single-sided cooling. The described semiconductor devices may reduce handling and routing effort for the customer. The semiconductor devices may be fabricated using a cost optimized approach based on lead frame stacking before encapsulation without modifying die and wire bonding processes. The semiconductor devices with double-sided cooling may include discrete devices with double the maximum chip size or multi-chip devices (e.g., half bridges, power factor correction stages) within packages sized similarly to semiconductor devices having only single-sided cooling. Therefore, the semiconductor devices described herein provide increased options for additional functionally and increased density.

Figure 1A:
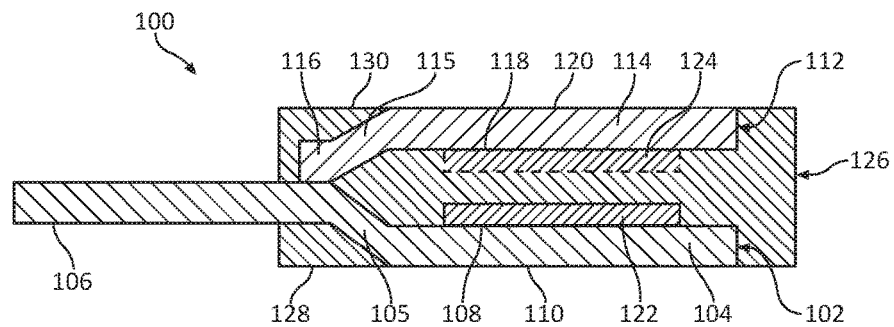
FIGS. 1A-1C illustrate one example of a through-hole semiconductor device.
Figure 1B:
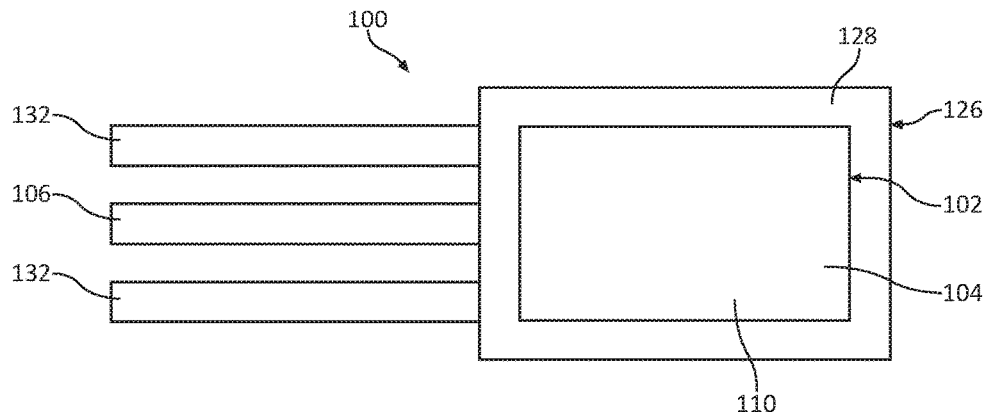
Figure 1C:
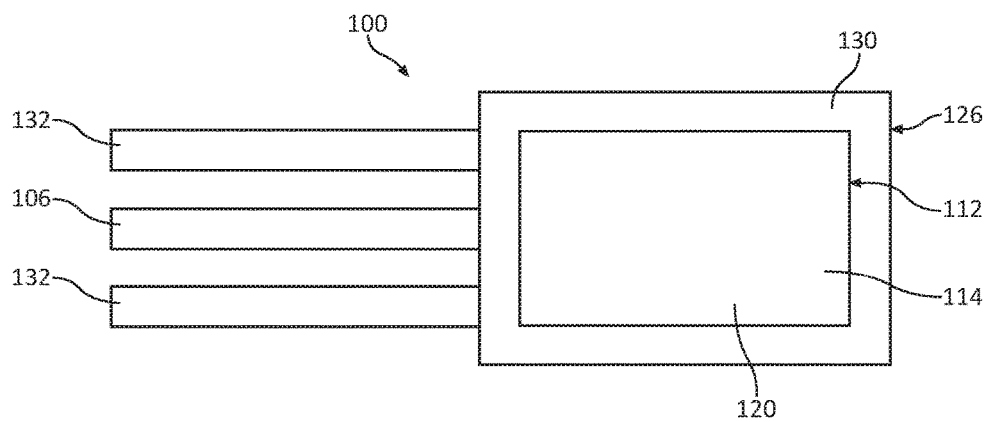

FIG. 1A illustrates a cross-sectional view, FIG. 1B illustrates a bottom view, and FIG. 1C illustrates a top view of one example of a through-hole semiconductor device 100. Semiconductor device 100 includes a first lead frame 102, a second lead frame 112, a first semiconductor chip 122, and an encapsulation material 126. In one example, semiconductor device 100 also includes a second semiconductor chip 124, which is indicated by dashed lines.

First lead frame 102 includes a first die pad 104 and leads 106 and 132. Lead 106 is coupled to first die pad 104 through a portion 105 of first lead frame 102. First die pad 104 includes a first surface 108 and a second surface 110 opposite to first surface 108. Second lead frame 112 includes a second die pad 114 and a lead portion 116. Lead portion 116 is coupled to second die pad 114 through a portion 115 of second lead frame 112. Second die pad 114 includes a first surface 118 and a second surface 120 opposite to first surface 118. First surface 118 of second die pad 114 faces first surface 108 of first die pad 104. Second lead frame 112 is attached to first lead frame 102 via lead portion 116, which may be welded, soldered, sintered, glued, or attached using another suitable technique to lead 106 of first lead frame 102.

First semiconductor chip 122 is attached to first surface 108 of first die pad 104. In one example, first semiconductor chip 122 is electrically coupled to first surface 108 of first die pad 104. Second semiconductor chip 124 may be attached to first surface 118 of second die pad 114. In one example, second semiconductor chip 124 may be electrically coupled to first surface 118 of second die pad 114. First semiconductor chip 122 and/or second semiconductor chip 124 may be electrically coupled to lead 106 and/or leads 132 via bond wires (not shown). First semiconductor chip 122 and/or second semiconductor chip 124 may be power devices (e.g., transistors, diodes) having a vertical current flow. In one example, first semiconductor chip 122 and second semiconductor chip 124 provide a half bridge and/or power factor correction stage. In another example, one of first semiconductor chip 122 and second semiconductor chip 124 is a power device and the other one of the first semiconductor chip 122 and second semiconductor chip 124 is a logic device (e.g., gate driver, temperature sensor, current sensor, microcontroller) for controlling the power device.

Encapsulation material (e.g., mold material) 126 encapsulates first semiconductor chip 122, second semiconductor chip 124, and portions of first lead frame 102 and second lead frame 112. Encapsulation material 126 has a first surface 128 aligned with second surface 110 of first die pad 104 and a second surface 130 aligned with second surface 120 of second die pad 114. Accordingly, second surface 110 of first die pad 104 and second surface 120 of second die pad 114 are exposed and may be used for double-sided cooling of semiconductor device 100 by attaching a heat sink to each surface.

Figure 2:
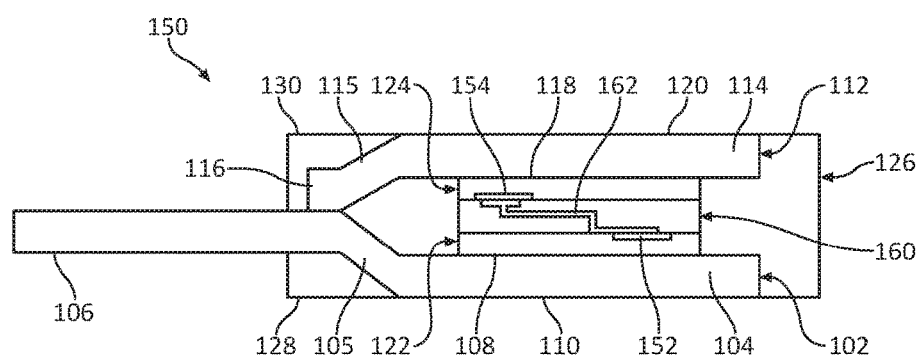
FIG. 2 illustrates a cross-sectional view of another example of a through-hole semiconductor device.

FIG. 2 illustrates a cross-sectional view of another example of a through-hole semiconductor device 150. Semiconductor device 150 is similar to semiconductor device 100 previously described and illustrated with reference to FIGS. 1A-1C, except that semiconductor device 150 also includes an interconnect board 160. In one example, interconnect board 160 is a printed circuit board (PCB). In this example, first semiconductor chip 122 includes at least one contact 152 and second semiconductor chip 124 includes at least one contact 154. Interconnect board 160 is electrically coupled to contact 152 of first semiconductor chip 122 and contact 154 of second semiconductor chip 124 via soldering, sintering, gluing, or another suitable technique. Interconnect board 160 electrically couples contact 152 to contact 154 via a signal line 162 of interconnect board 160.

Figure 3A:
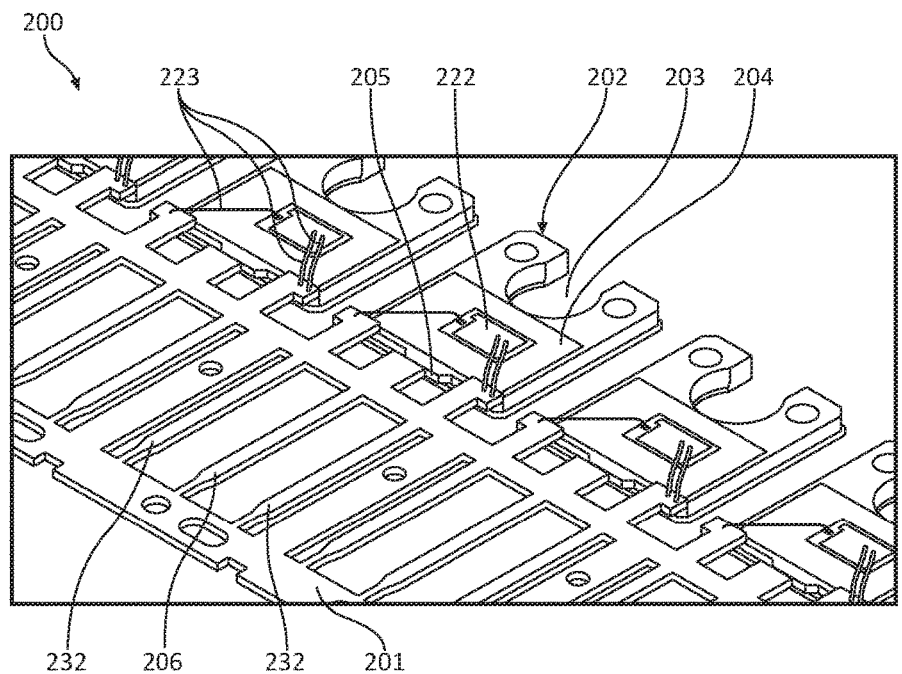
FIGS. 3A-3F illustrate one example of a method for fabricating a through-hole semiconductor device.

FIGS. 3A-3F illustrate one example of a method for fabricating a through-hole semiconductor device, such as semiconductor device 100 previously described and illustrated with reference to FIGS. 1A-1C. FIG. 3A illustrates one example of a front-end-of-line (FEOL) process for fabricating a first portion of the semiconductor device. A first lead frame strip 200 including a plurality of first lead frames 202 connected to each other via a frame 201 is provided. Each first lead frame 202 includes a first die pad 204, leads 206 and 232, and a screw hole 203. In other examples, screw hole 203 is excluded. Each lead 206 is coupled to a first die pad 204 through a portion 205 of each first lead frame 202. A first semiconductor chip 222 is attached to each first die pad 204 via welding, soldering, sintering, gluing, or other suitable technique. Contacts on the upper surface of first semiconductor chip 222 are then electrically coupled to leads 232 using bond wires 223. In other examples, ribbon wire, clips, other suitable interconnects, or combinations thereof may be used in place of or in combination with bond wires.

Figure 3B:
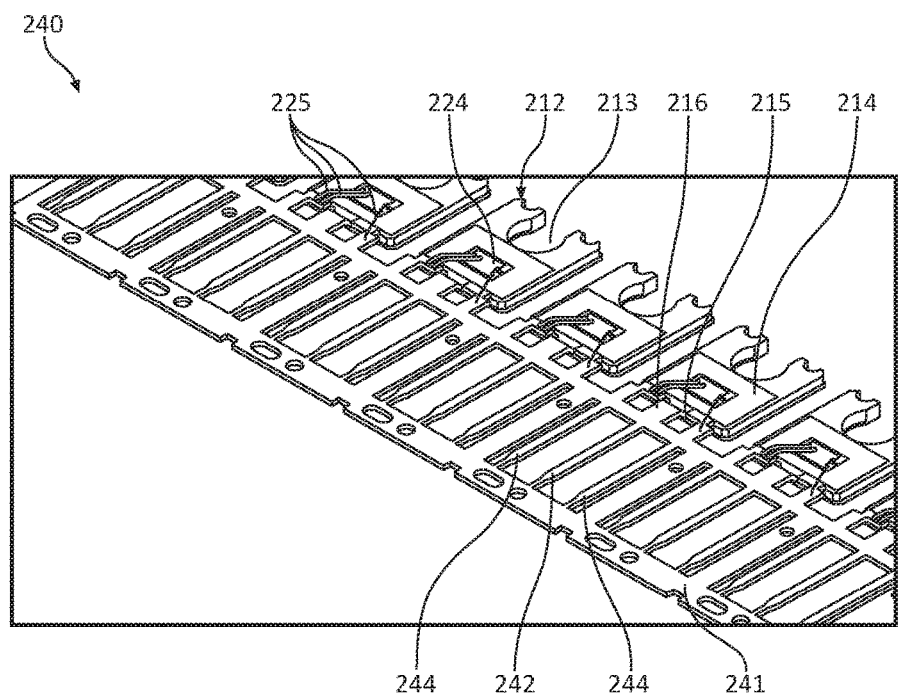

FIG. 3B illustrates one example of a FEOL process for fabricating a second portion of the semiconductor device. A second lead frame strip 240 including a plurality of second lead frames 212 connected to each other via a frame 241 is provided. In one example, second lead frame strip 240 is identical to first lead frame strip 200 previously described and illustrated with reference to FIG. 3A. Each second lead frame 212 includes a second die pad 214, leads 242 and 244, and a screw hole 213. In other examples, screw hole 213 is excluded. Each lead 242 is coupled to a second die pad 214 through lead portions 216 and 215 of each second lead frame 212. A second semiconductor chip 224 is attached to each second die pad 214 via welding, soldering, sintering, gluing, or other suitable technique. Contacts on the upper surface of second semiconductor chip 224 are then electrically coupled to leads 244 using bond wires 225.

Figure 3C:
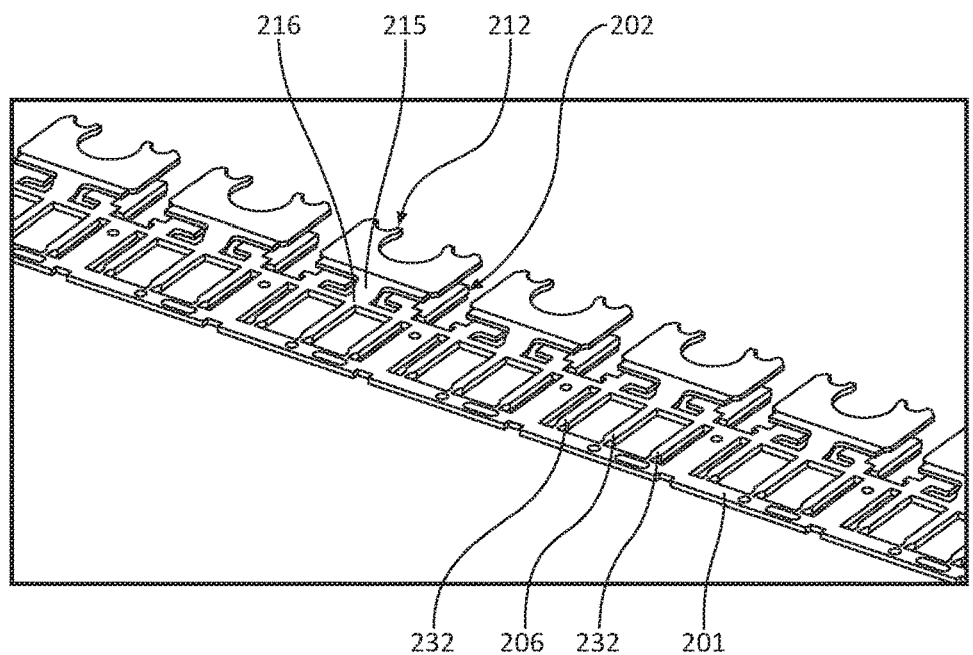

FIG. 3C illustrates one example of a back-end-of-line (BEOL) process for fabricating the semiconductor device. Second lead frame strip 240 is stacked on first lead frame strip 200 such that first semiconductor chip 222 faces second semiconductor chip 224. Lead portion 216 of each second lead frame 212 is welded or attached using another suitable technique to lead 206 of each first lead frame 202. A portion of each lead 244 of each second lead frame 212 is welded or attached using another suitable technique to a corresponding lead 232 of each first lead frame 202. Frame 241 of second lead frame strip 240 and portions of leads 242 and 244 of each second lead frame 212 are then cut away to provide the assembly illustrated in FIG. 3C.

Figure 3D:
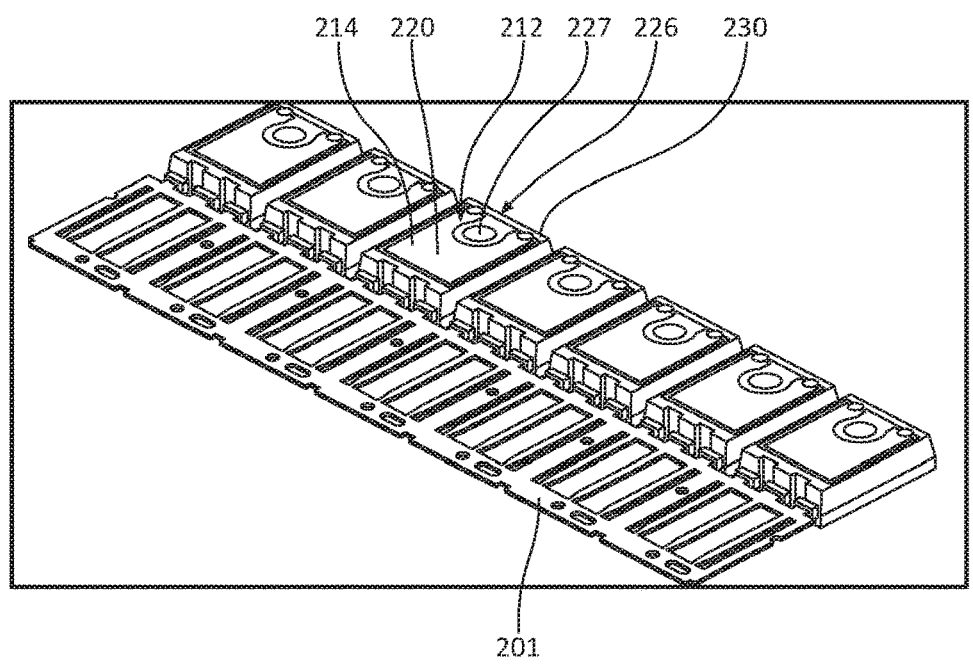
Figure 3E:
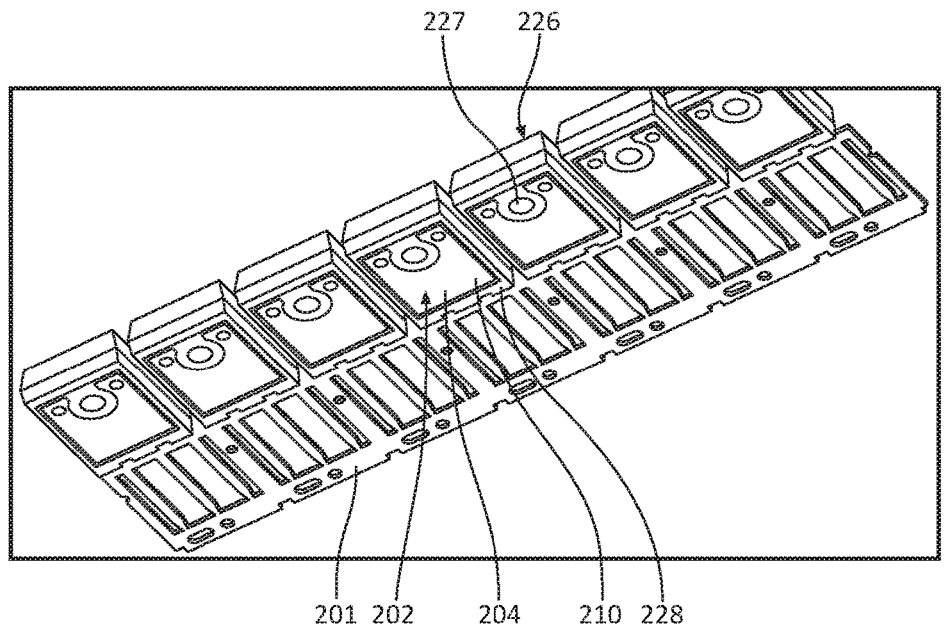

FIG. 3D illustrates a top view and FIG. 3E illustrates a bottom view of one example of the assembly illustrated in FIG. 3C after encapsulation using a BEOL process. Each first semiconductor chip 222, second semiconductor chip 224, bond wires 223 and 225, and portions of each first lead frame 202 and second lead frame 212 are encapsulated with an encapsulation material 226 (e.g., mold material) such that a surface 210 of each first die pad 204 and a surface 220 of each second die pad 214 remains exposed. A first surface 228 of encapsulation material 226 is aligned with surface 210 of each first die pad 204. A second surface 230 of encapsulation material 226 opposite to first surface 228 is aligned with surface 220 of each second die pad 214. Encapsulation material 226 defines a screw hole 227 extending from first surface 228 of encapsulation material 226 to second surface 230 of encapsulation material 226.

Figure 3F:
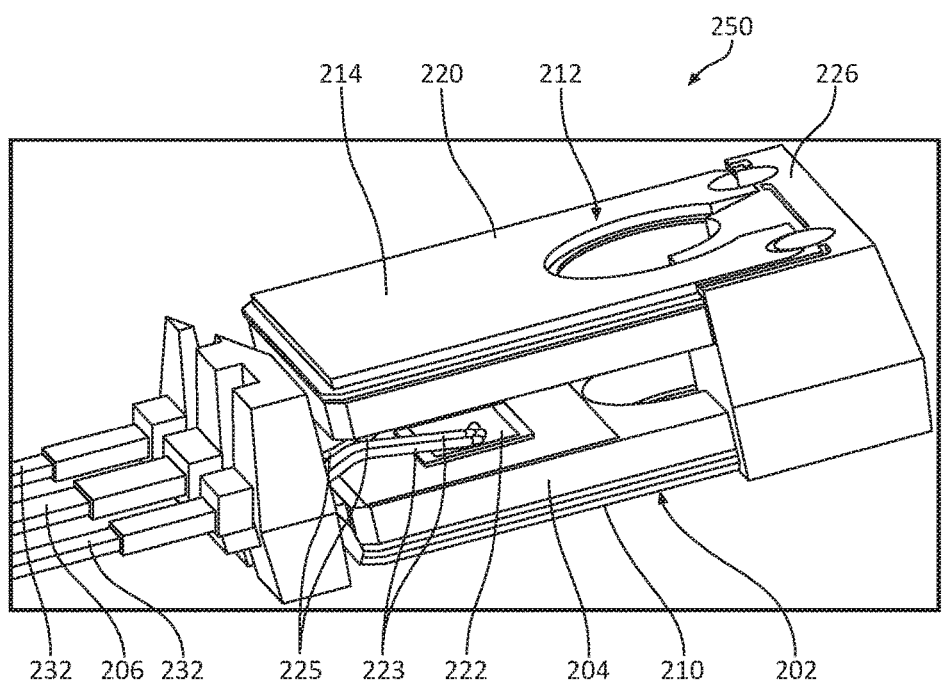

FIG. 3F illustrates one example of a semiconductor device 250 with a portion of encapsulation material 226 removed to show the interior of semiconductor device 250 after singulation. Frame 201 of first lead frame strip 200 is cut away to singulate each semiconductor device 250. Semiconductor device 250 includes a first lead frame 202, a second lead frame 212, a first semiconductor chip 222, a second semiconductor chip 224 (visible in FIG. 3B), bond wires 223 and 225, and encapsulation material 226. A heat sink may be attached to surface 210 of first die pad 204 and first surface 228 of encapsulation material 226 and attached to surface 220 of second die pad 214 and second surface 230 of encapsulation material 226 to provide double-sided cooling for semiconductor device 250.

Figure 4A:
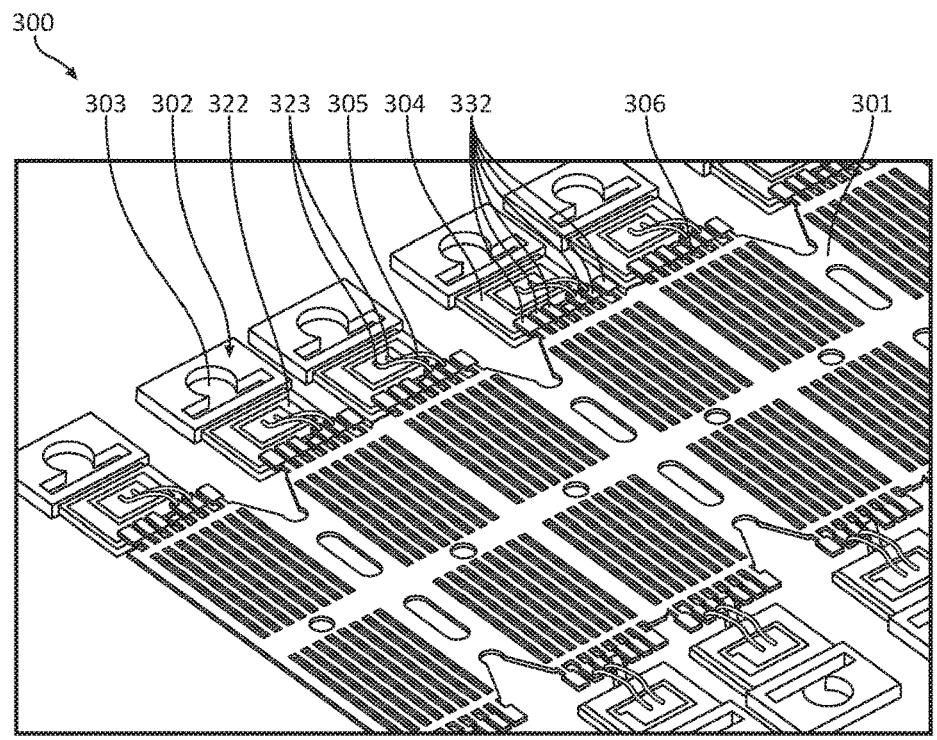
FIGS. 4A-4E illustrate one example of a method for fabricating a surface mount technology (SMT) semiconductor device.

FIGS. 4A-4E illustrate one example of a method for fabricating a surface mount technology (SMT) semiconductor device. FIG. 4A illustrates one example of a FEOL process for fabricating a first portion of the semiconductor device. A first lead frame matrix 300 including a plurality of first lead frames 302 connected to each other and arranged in two rows via a frame 301 is provided. Each first lead frame 302 includes a first die pad 304, leads 306 and 332, and a screw hole 303. In other examples, screw hole 303 is excluded. Each lead 306 is coupled to a first die pad 304 through a portion 305 of each first lead frame 302. A first semiconductor chip 322 is attached to each first die pad 304 via welding, soldering, sintering, gluing, or other suitable technique. Contacts on the upper surface of first semiconductor chip 322 are then electrically coupled to leads 332 using bond wires 323. A similar process is used to fabricate a second portion of the semiconductor device including a second lead frame matrix including a plurality of second lead frames 312 (FIG. 4B) and second semiconductor chips.

Figure 4B:
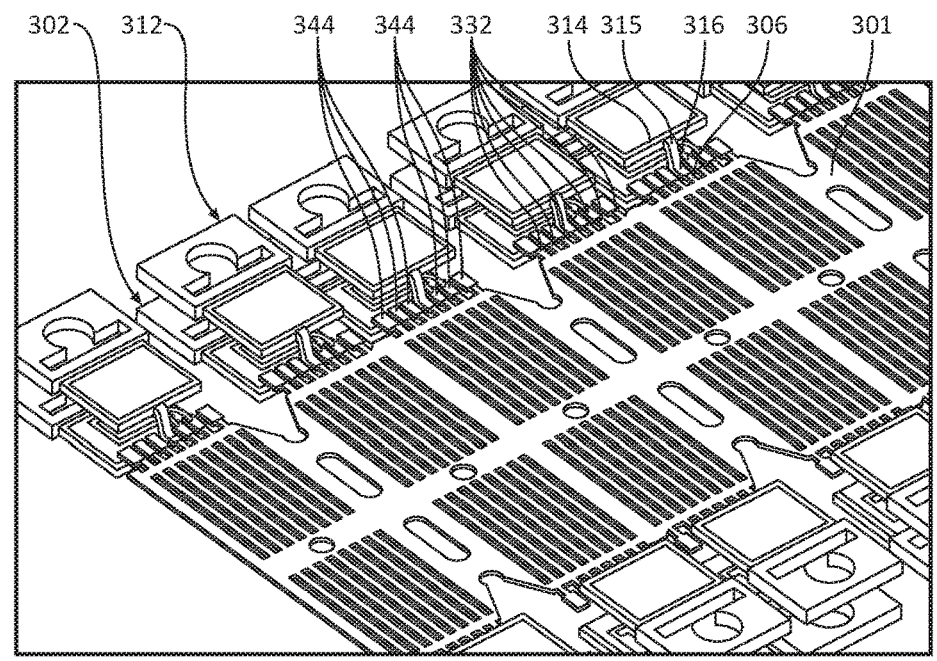

FIG. 4B illustrates one example of a back-end-of-line (BEOL) process for fabricating the semiconductor device. A second lead frame strip is stacked on first lead frame strip 300 such that first semiconductor chip 322 faces the second semiconductor chip attached to each second lead frame 312. A lead portion 316 of each second lead frame 312 is welded or attached using another suitable technique to lead 306 of each first lead frame 302. Each lead portion 316 is coupled to a die pad 314 through a portion 315 of each second lead frame 312. A portion of each lead 344 of each second lead frame 312 is welded or attached using another suitable technique to a corresponding lead 332 of each first lead frame 302. The frame of the second lead frame matrix and portions of leads 316 and 344 of each second lead frame 312 are then cut away to provide the assembly illustrated in FIG. 4B.

Figure 4C:
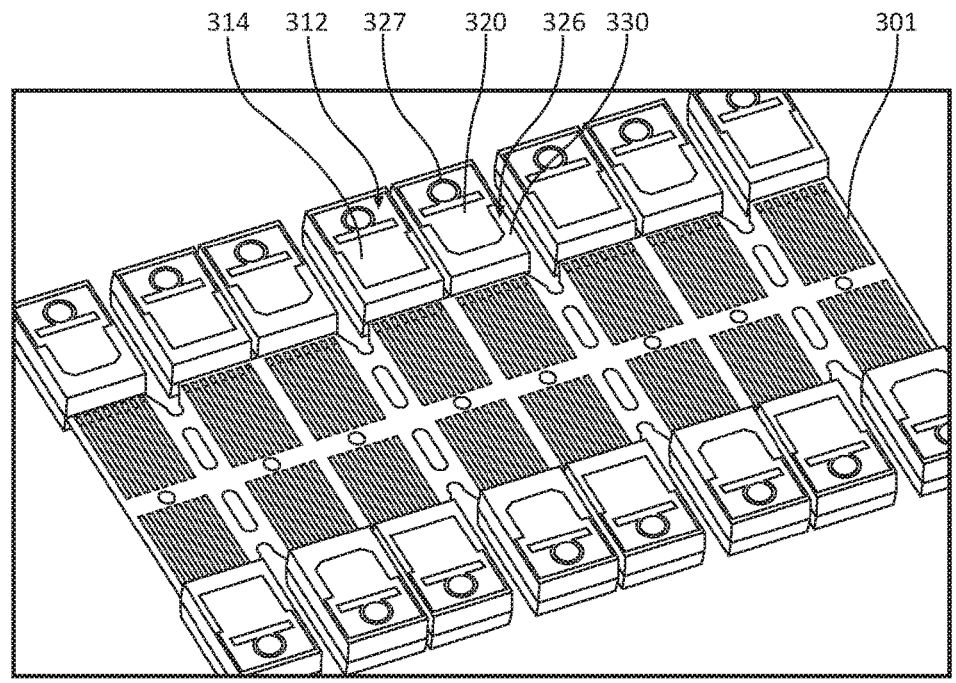
Figure 4D:
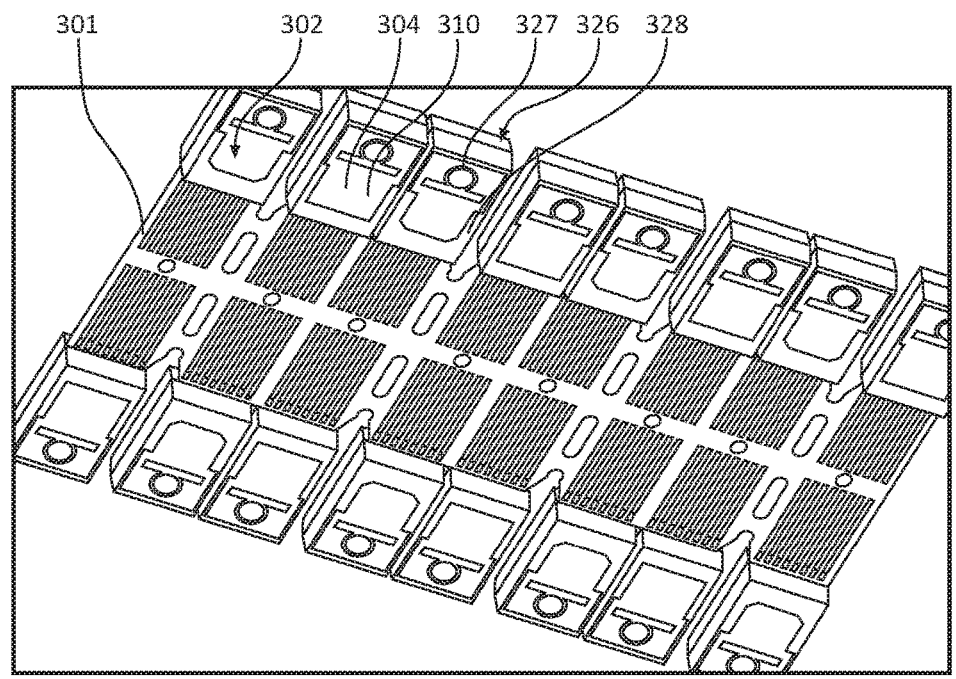

FIG. 4C illustrates a top view and FIG. 4D illustrates a bottom view of one example of the assembly illustrated in FIG. 4B after encapsulation using a BEOL process. Each first semiconductor chip 322, each second semiconductor chip, bond wires 323, and portions of each first lead frame 302 and each second lead frame 312 are encapsulated with an encapsulation material 326 (e.g., mold material) such that a surface 310 of each first die pad 304 and a surface 320 of each second die pad 314 remains exposed. A first surface 328 of encapsulation material 326 is aligned with surface 310 of each first die pad 304. A second surface 330 of encapsulation material 326 opposite to first surface 328 is aligned with surface 320 of each second die pad 314. Encapsulation material 326 defines a screw hole 327 extending from first surface 328 of encapsulation material 326 to second surface 330 of encapsulation material 326.

Figure 4E:
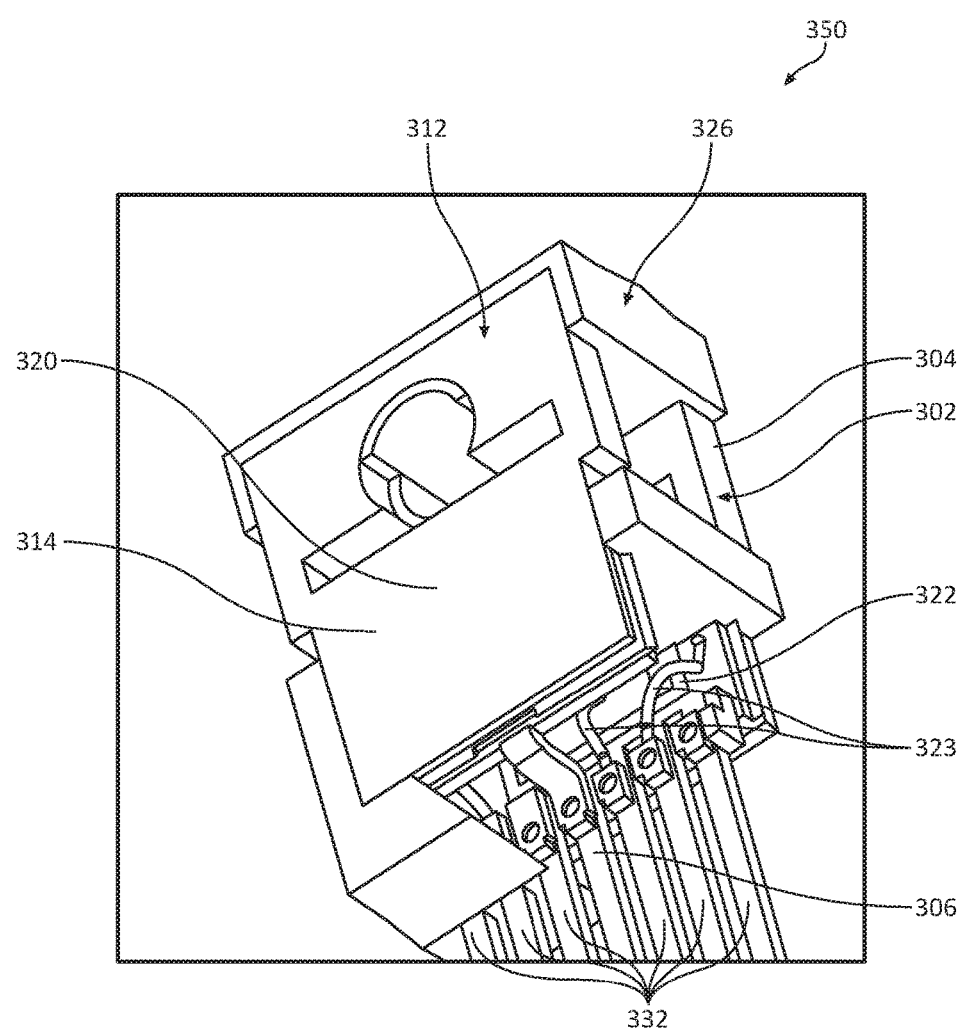

FIG. 4E illustrates one example of a semiconductor device 350 with a portion of encapsulation material 326 removed to show the interior of semiconductor device 350 after singulation. Frame 301 of lead frame matrix 300 is cut away to singulate each semiconductor device 350. Semiconductor device 350 includes a first lead frame 302, a second lead frame 312, a first semiconductor chip 322, a second semiconductor chip (not visible), bond wires 323, and encapsulation material 326. A heat sink may be attached to surface 310 of first die pad 304 and to surface 320 of second die pad 314 to provide double-sided cooling for semiconductor device 350.

Figure 5A:
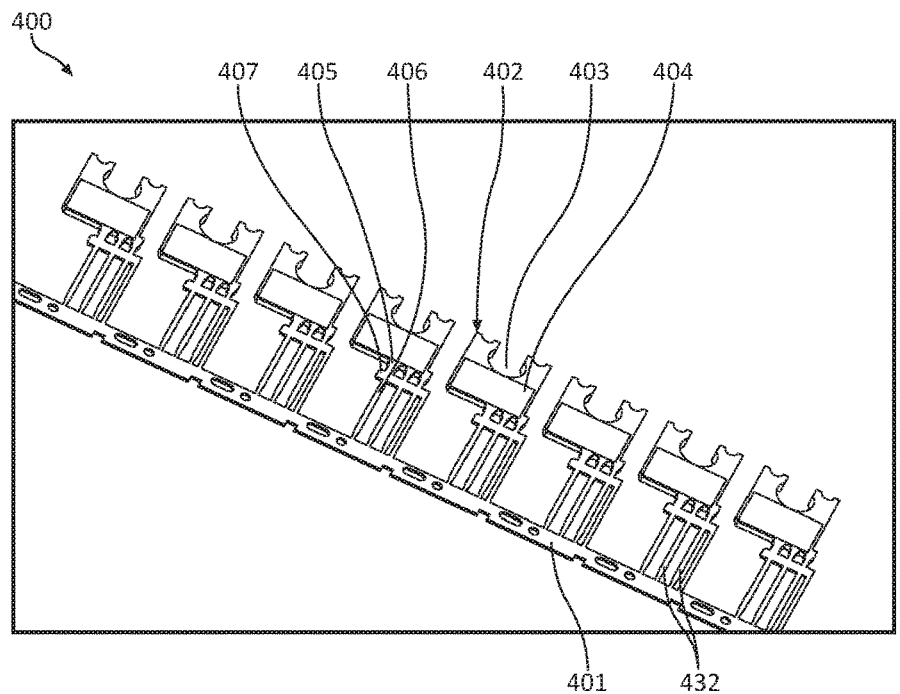
FIGS. 5A-5E illustrate one example of a method for fabricating a semiconductor device including independent semiconductor chips.

FIGS. 5A-5E illustrate one example of a method for fabricating a semiconductor device including independent semiconductor chips. FIG. 5A illustrates one example of a first lead frame strip 400. First lead frame strip 400 includes a plurality of first lead frames 402 connected to each other via a frame 401. Each first lead frame 402 includes a first die pad 404, leads 406 and 432, an interconnect portion 407, and a screw hole 403. In other examples, screw hole 403 is excluded. Each lead 406 is coupled to a first die pad 404 through a portion 405 of each first lead frame 402.

Figure 5B:
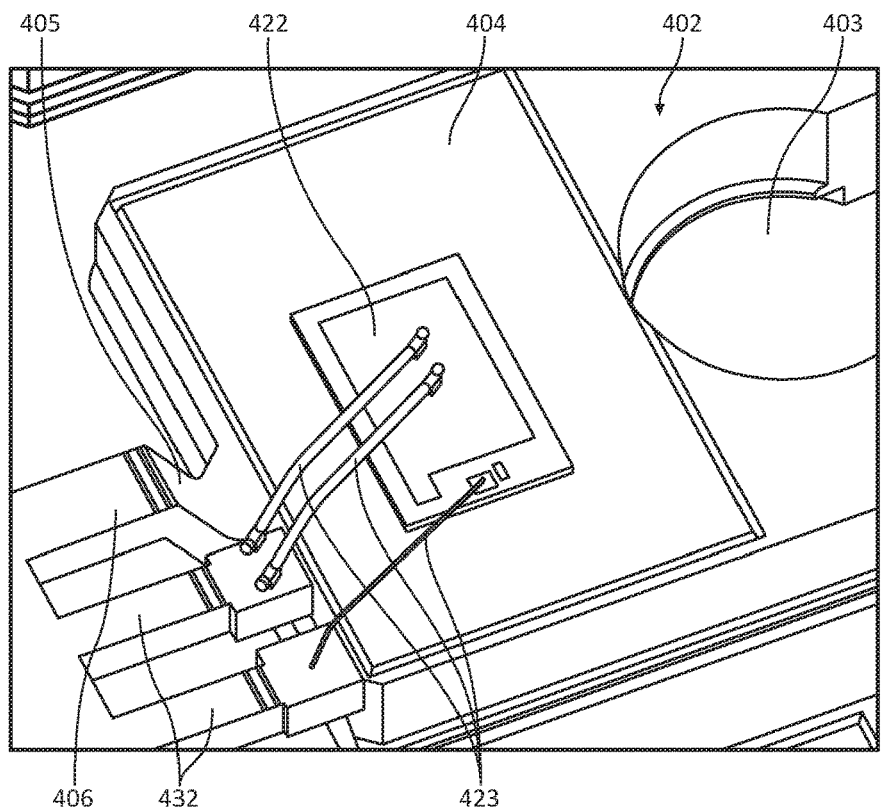

FIG. 5B illustrates one example of a FEOL process for fabricating a first portion of the semiconductor device. A first semiconductor chip 422 is attached to each first die pad 404 via welding, soldering, sintering, gluing, or other suitable technique. Contacts on the upper surface of first semiconductor chip 422 are then electrically coupled to leads 432 using bond wires 423.

Figure 5C:
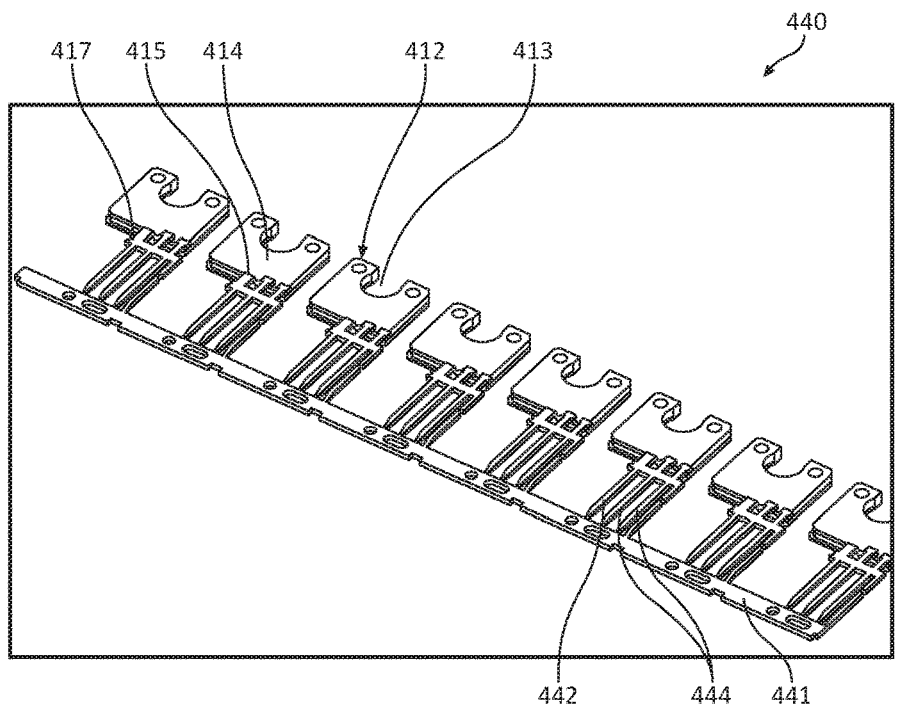

FIG. 5C illustrates one example of a second lead frame strip 440. Second lead frame strip 440 includes a plurality of second lead frames 412 connected to each other via a frame 441. In one example, second lead frame strip 440 is identical to first lead frame strip 400 previously described and illustrated with reference to FIG. 5A. Each second lead frame 412 includes a second die pad 414, leads 442 and 444, an interconnect portion 417, and a screw hole 413. In other examples, screw hole 413 is excluded. Each lead 442 is coupled to a second die pad 414 through a portion 415 of each second lead frame 412.

Figure 5D:
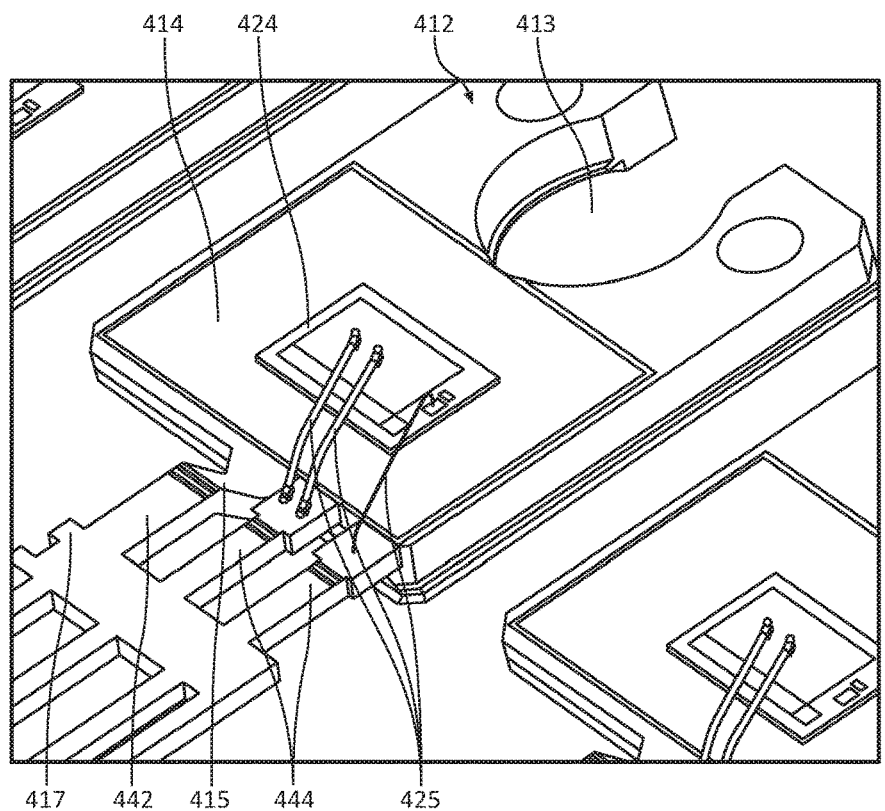

FIG. 5D illustrates one example of a FEOL process for fabricating a second portion of the semiconductor device. A second semiconductor chip 424 is attached to each second die pad 414 via welding, soldering, sintering, gluing, or other suitable technique. Contacts on the upper surface of second semiconductor chip 424 are then electrically coupled to leads 444 using bond wires 425.

Figure 5E:
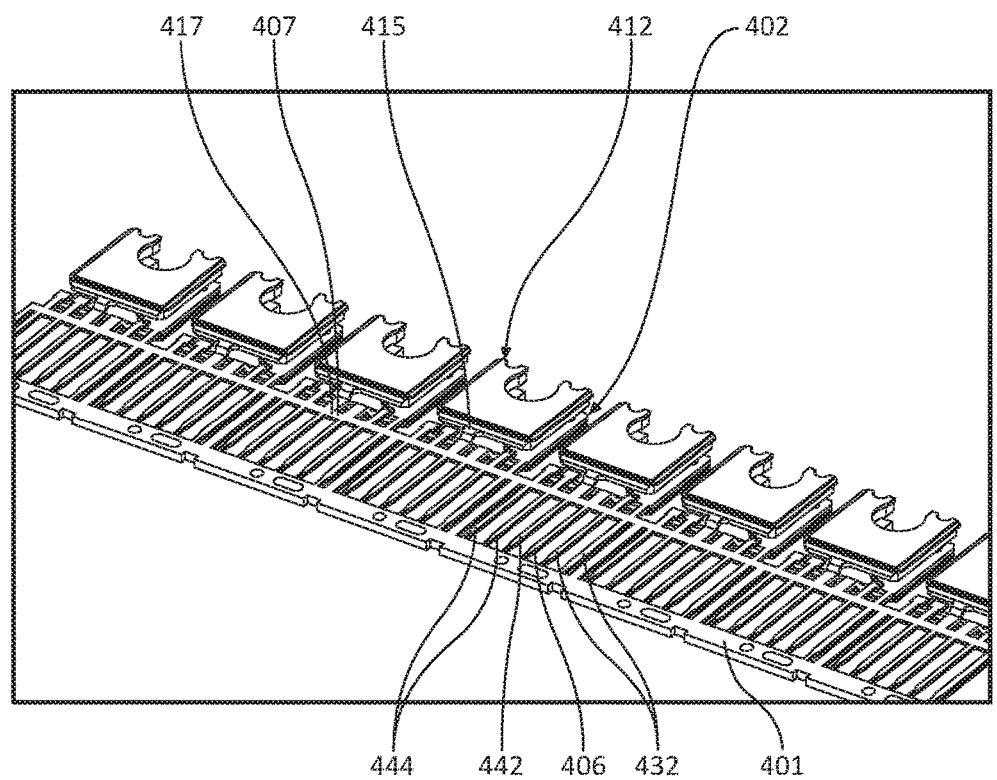

FIG. 5E illustrates one example of a BEOL process for fabricating the semiconductor device. Second lead frame strip 440 is stacked on first lead frame strip 400 such that first semiconductor chip 422 faces second semiconductor chip 424. Interconnect portion 417 of each second lead frame 412 is welded or attached using another suitable technique to interconnect portion 407 of each first lead frame 402. Leads 442 and 444 of each second lead frame 412 are aligned with leads 406 and 432 of each first lead frame 402. No cutting of either first lead frame strip 400 or second lead frame strip 440 is performed during this stacking process. The assembly illustrated in FIG. 5E is then encapsulated and the semiconductor devices are singulated to provide individual semiconductor devices for double-sided cooling.

Figure 6:
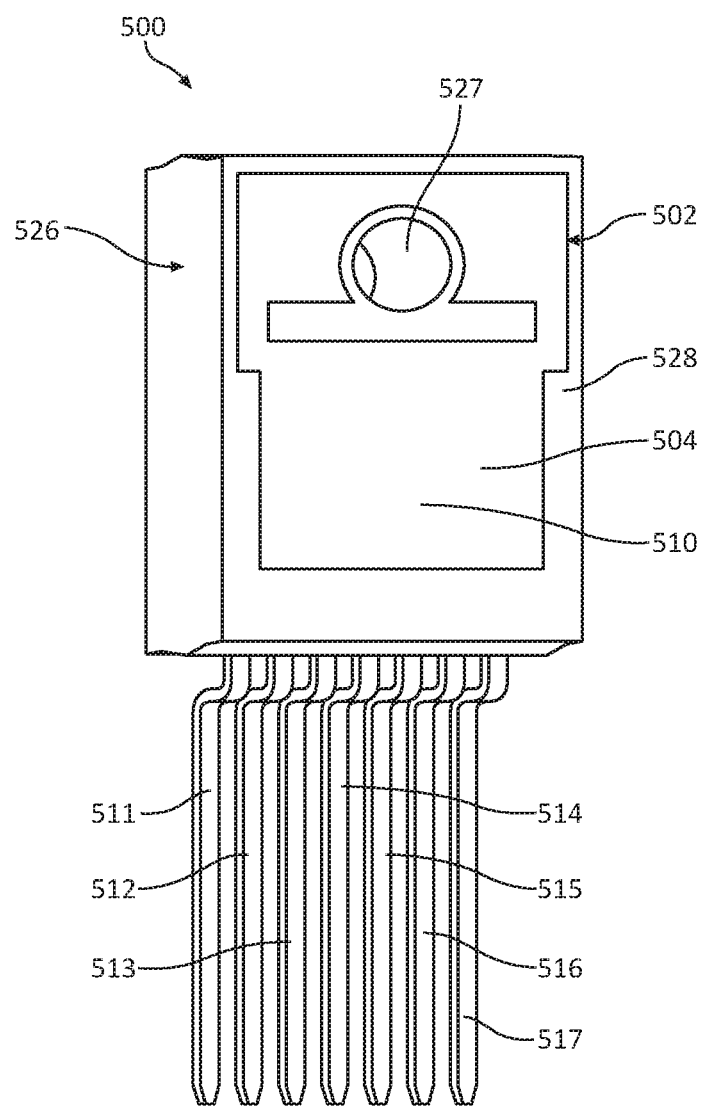
FIG. 6 illustrates one example of a semiconductor device having independent semiconductor chips.

FIG. 6 illustrates one example of a semiconductor device 500 having independent semiconductor chips. Semiconductor device 500 includes a first lead frame 502 including a first die pad 504, a second lead frame (not visible) including a second die pad opposite to first die pad 504, leads 511-517, and encapsulation material 526. A surface 510 of first die pad 504 is aligned with a first surface 528 of encapsulation material 526. Likewise, a surface of the second die pad is aligned with a second surface of encapsulation material 526 opposite to first surface 528 of encapsulation material 526. Encapsulation material 526 defines a screw hole 527. In other examples, screw hole 527 may be excluded.

Semiconductor device 500 also includes a first transistor chip (not visible) attached to first die pad 504 and a second transistor chip (not visible) attached to the second die pad. The gate of the first transistor chip is electrically coupled to lead 511. The drain of the first transistor chip is electrically coupled to lead 512. The source of the first transistor chip is electrically coupled to lead 513. In one example, the drain of the first transistor chip and the drain of the second transistor chip are electrically coupled to lead 514. In another example, the drain of the first transistor chip and/or the drain of the second transistor chip are not connected to lead 514. The source of the second transistor chip is electrically coupled to lead 515. The drain of the second transistor chip is electrically coupled to lead 516. The gate of the second transistor chip is electrically coupled to lead 517. Semiconductor device 500 may be fabricated using the method previously described and illustrated with reference to FIGS.

3A-3F or FIGS. 5A-5E. One semiconductor device 500 including two transistors chips may be used in place of two similar sized semiconductor devices having a single transistor chip.

Figure 7:
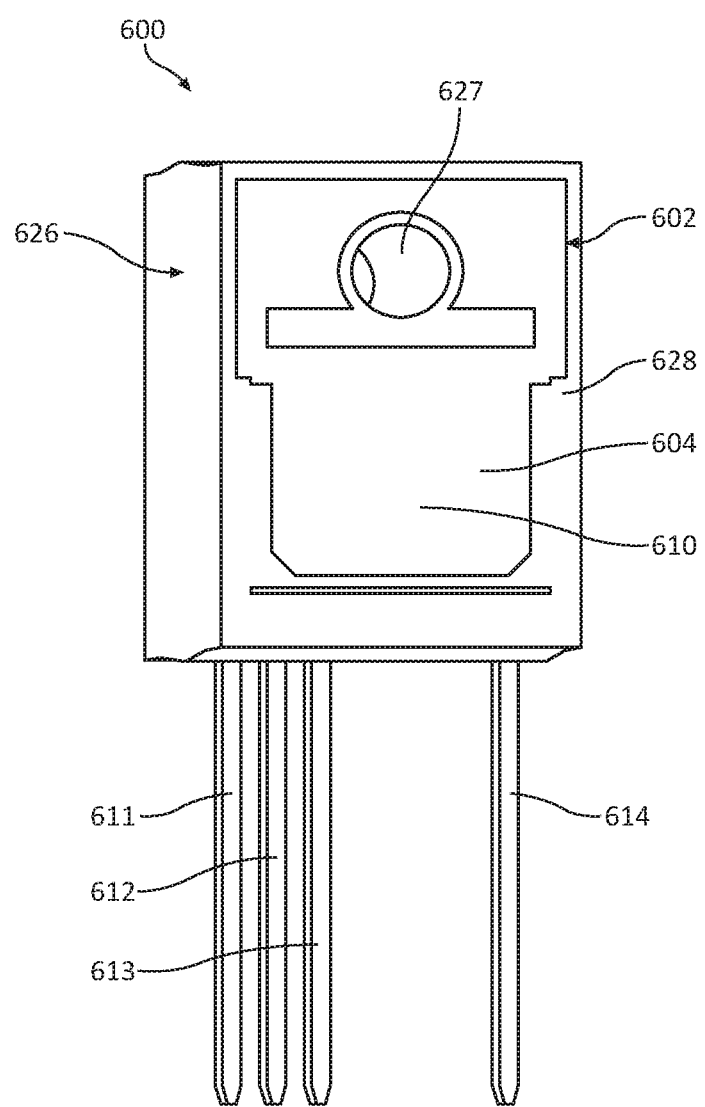
FIG. 7 illustrates another example of a semiconductor device having independent semiconductor chips.

FIG. 7 illustrates another example of a semiconductor device 600 having independent semiconductor chips. Semiconductor device 600 includes a first lead frame 602 including a first die pad 604, a second lead frame (not visible) including a second die pad opposite to first die pad 604, leads 611-614, and encapsulation material 626. A surface 610 of first die pad 604 is aligned with a first surface 628 of encapsulation material 626. Likewise, a surface of the second die pad is aligned with a second surface of encapsulation material 626 opposite to first surface 628 of encapsulation material 626. Encapsulation material 626 defines a screw hole 627. In other examples, screw hole 627 may be excluded.

Semiconductor device 600 also includes a first transistor chip (not visible) attached to first die pad 604 and a second transistor chip (not visible) attached to the second die pad. The gate of the first transistor chip is electrically coupled to lead 611. The source of the first transistor chip is electrically coupled to lead 612. The drain of the second transistor chip is electrically coupled to lead 613. The gate of the second transistor chip is electrically coupled to lead 614. The drain of the first transistor chip is electrically coupled to the source of the second transistor chip within semiconductor device 600 to provide a half bridge. The spacing between leads 611-614 may be adjusted to provide desired creepage distances. Semiconductor device 600 may be fabricated using the method previously described and illustrated with reference to FIGS. 3A-3F or FIGS. 5A-5E. One semiconductor device 600 including two transistors chips may be used in place of two similar sized semiconductor devices having a single transistor chip.

Figure 8:
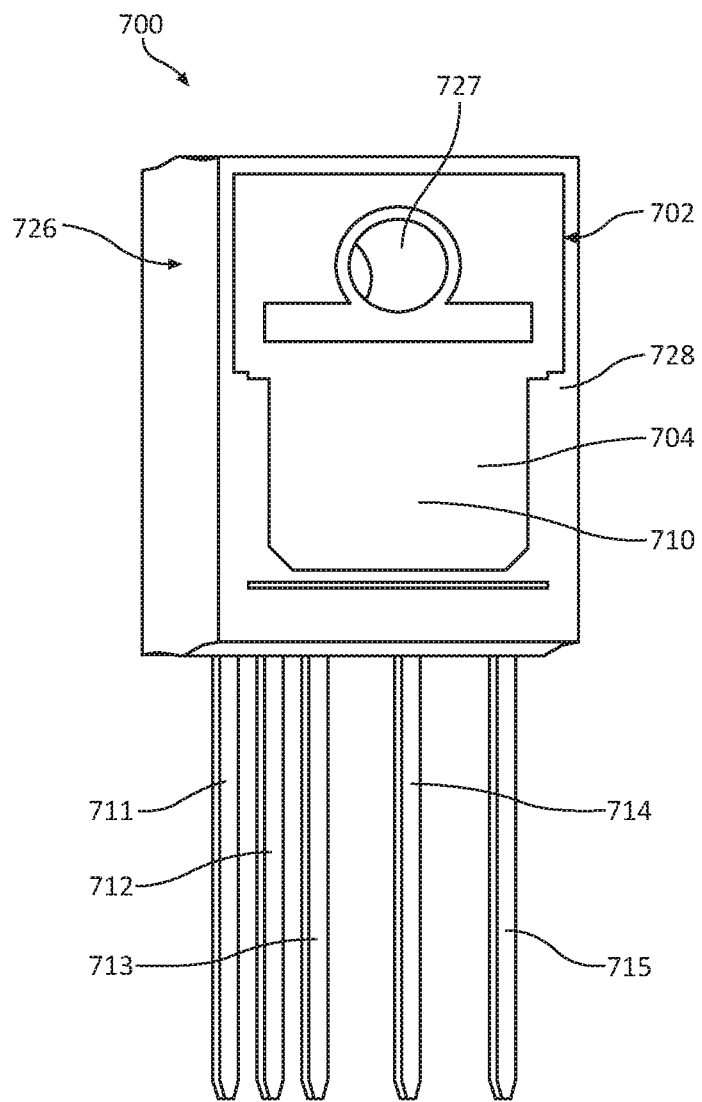
FIG. 8 illustrates one example of a semiconductor device having an external drain/source interconnect.

FIG. 8 illustrates one example of a semiconductor device 700 having an external drain/source interconnect. Semiconductor device 700 includes a first lead frame 702 including a first die pad 704, a second lead frame (not visible) including a second die pad opposite to first die pad 704, leads 711-715, and encapsulation material 726. A surface 710 of first die pad 704 is aligned with a first surface 728 of encapsulation material 726. Likewise, a surface of the second die pad is aligned with a second surface of encapsulation material 726 opposite to first surface 728 of encapsulation material 726. Encapsulation material 726 defines a screw hole 727. In other examples, screw hole 727 may be excluded.

Semiconductor device 700 also includes a first transistor chip (not visible) attached to first die pad 704 and a second transistor chip (not visible) attached to the second die pad. The gate of the first transistor chip is electrically coupled to lead 711. The source of the first transistor chip is electrically coupled to lead 712. The drain of the second transistor chip is electrically coupled to lead 713. The drain of the first transistor chip and the source of the second transistor chip are electrically coupled to lead 714 to provide a half bridge. The gate of the second transistor chip is electrically coupled to lead 715. The spacing between leads 711-715 may be adjusted to provide desired creepage distances. Semiconductor device 700 may be fabricated using the method previously described and illustrated with reference to FIGS. 3A-3F or FIGS. 5A-5E. One semiconductor device 700 including two transistors chips may be used in place of two similar sized semiconductor devices having a single transistor chip.

Figure 9A:
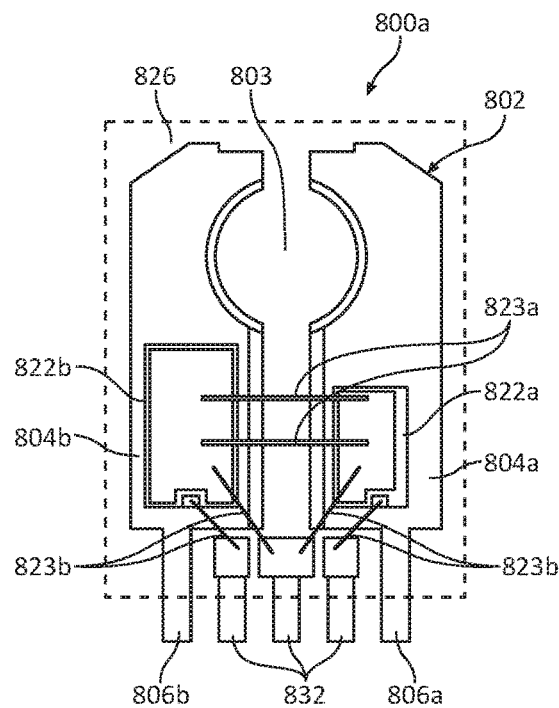
FIGS. 9A-9B illustrate one example of a semiconductor device having split die pads.
Figure 9B:
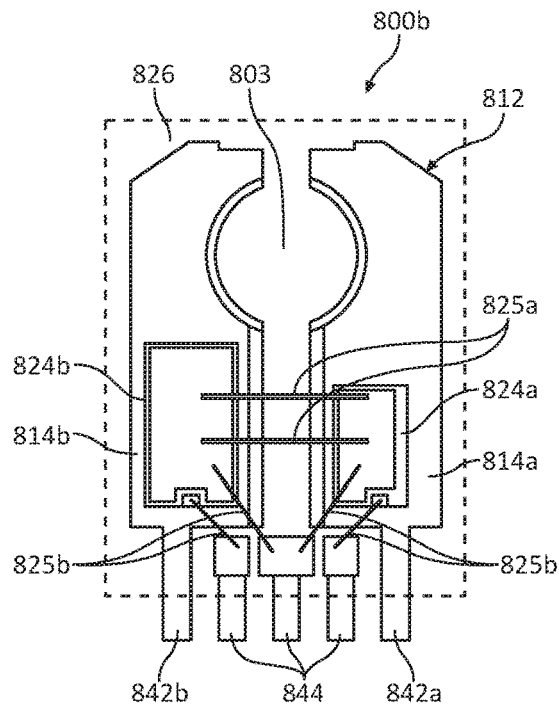

FIG. 9A illustrates a first portion 800a and FIG. 9B illustrates a second portion 800b of one example of a semiconductor device having split die pads. Portion 800a includes a first split die pad 802, and portion 800b includes a second split die pad 812. First split die pad 802 includes a first die pad 804a, and second split die pad 812 includes a second die pad 814a. First split die pad 802 also includes a third die pad 804b, and second split die pad 812 also includes a fourth die pad 814b. First split die pad 802 includes leads 806a, 806b, and 832, and second split die pad 812 includes leads 842a, 842b, and 844. Lead 806a is electrically coupled to first die pad 804a, and lead 806b is electrically coupled to third die pad 804b. Lead 842a is electrically coupled to second die pad 814a, and lead 842b is electrically coupled to fourth die pad 814b.

An exposed surface of first die pad 804a and an exposed surface of third die pad 804b are aligned with a first surface of encapsulation material 826. Likewise, an exposed surface of second die pad 814a and an exposed surface of fourth die pad 814b are aligned with a second surface of encapsulation material 826 opposite to the first surface of encapsulation material 826. Encapsulation material 826, first split die pad 802, and second split die pad 812 define a screw hole 803. In other examples, screw hole 803 may be excluded.

First portion 800a also includes a first semiconductor chip 822a attached to first die pad 804a, and second portion 800b includes a second semiconductor chip 824a attached to second die pad 814a. First portion 800a also includes a third semiconductor chip 822b attached to third die pad 804b, and second portion 800b includes a fourth semiconductor chip 824b attached to fourth die pad 814b. First semiconductor chip 822a and third semiconductor chip 822b are electrically coupled to each other via bond wires 823a and to leads 832 via bond wires 823b. Second semiconductor chip 824a and fourth semiconductor chip 824b are electrically coupled to each other via bond wires 825a and to leads 844 via bond wires 825b. Second portion 800b is stacked on first portion 800a such that first semiconductor chip 822a faces fourth semiconductor chip 824b and third semiconductor chip 822b faces second semiconductor chip 824a to provide a semiconductor device including four semiconductor chips with double-sided cooling.

Figure 10:
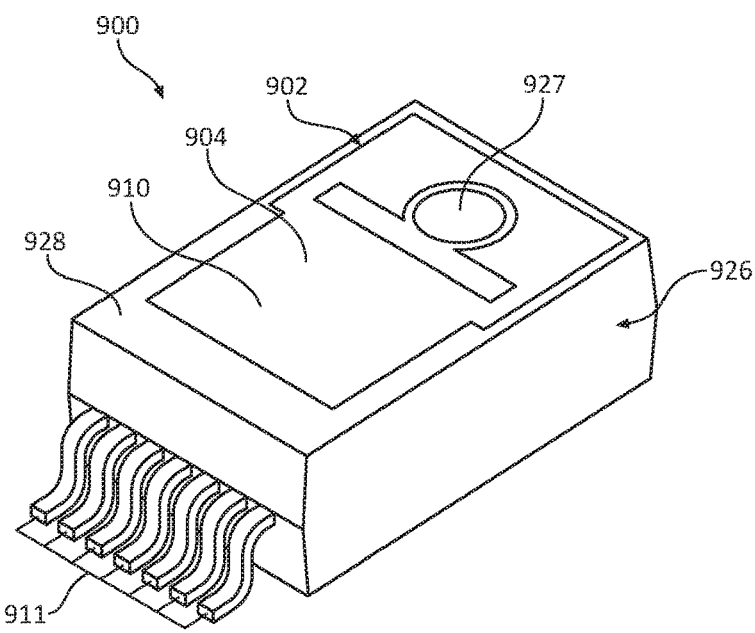
FIG. 10 illustrates one example of a SMT semiconductor device.

FIG. 10 illustrates one example of a SMT semiconductor device 900. Semiconductor device 900 includes a first lead frame 902 including a first die pad 904, a second lead frame including a second die pad (not visible) opposite to first die pad 904, leads 911, and encapsulation material 926. A surface 910 of first die pad 904 is aligned with a first surface 928 of encapsulation material 926. Likewise, a surface of the second die pad is aligned with a second surface of encapsulation material 926 opposite to first surface 928 of encapsulation material 926. Encapsulation material 926 defines a screw hole 927. In other examples, screw hole 927 may be excluded.

Semiconductor device 900 also includes a first semiconductor chip (not visible) attached to first die pad 904 and a second semiconductor chip (not visible) attached to the second die pad. The first semiconductor chip and the second semiconductor chip may be electrically coupled to each other and/or to leads 911. Semiconductor device 900 may be fabricated using the method previously described and illustrated with reference to FIGS. 4A-4E. One semiconductor device 900 including two semiconductor chips may be used in place of two similar sized semiconductor devices having a single semiconductor chip.

Figure 11:
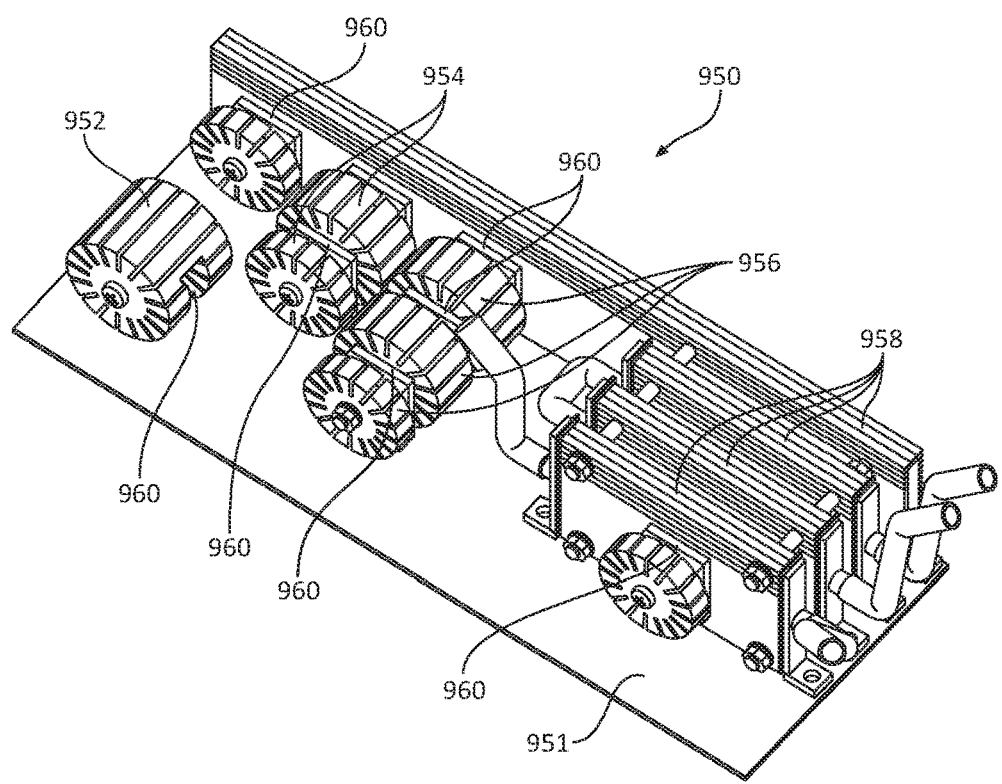
FIG. 11 illustrates one example of a system including heat sinks coupled to semiconductor devices with double-siding cooling.

FIG. 11 illustrates one example of a system 950 including heat sinks coupled to semiconductor devices with double-sided cooling. System 950 includes a PCB 951, a plurality of through-hole semiconductor devices 960 with double-sided cooling electrically coupled to PCB 951, and heat sinks 952, 954, 956, and 958 attached to PCB 951. Heat sink 952 is a single heat sink attached to both sides of a semiconductor device 960 with double-sided cooling. Heat sinks 954 are stacked such that one side of a heat sink may be attached to a first semiconductor device 960 and the other side of the heat sink may be attached to a second semiconductor device 960. Heat sinks 956 are stacked with semiconductor devices 960 to provide cooling for a plurality of semiconductor devices 960 with double-sided cooling. Heat sinks 958 provide liquid (e.g., water) cooling for semiconductor devices 960. Combinations of liquid and non-liquid cooling may also be used.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a first lead frame comprising a first die pad having a first surface and a second surface opposite to the first surface of the first die pad;
   a second lead frame comprising a second die pad having a first surface and a second surface opposite to the first surface of the second die pad, the first surface of the second die pad facing the first surface of the first die pad, wherein the second die pad is directly electrically connected to the first die pad;
   a first semiconductor chip attached to the first surface of the first die pad; and
   an encapsulation material encapsulating the first semiconductor chip and portions of the first lead frame and the second lead frame, the encapsulation material having a first surface aligned with the second surface of the first die pad and a second surface aligned with the second surface of the second die pad.

2. The semiconductor device of claim 1, further comprising:
   a second semiconductor chip attached to the first surface of the second die pad.

3. The semiconductor device of claim 2, wherein the first semiconductor chip is electrically coupled to the second semiconductor chip.

4. The semiconductor device of claim 1, further comprising:
   bond wires electrically coupling the first semiconductor chip to leads of the first lead frame.

5. A semiconductor device comprising:
   a first lead frame comprising a first die pad having a first surface and a second surface opposite to the first surface of the first die pad;
   a second lead frame comprising a second die pad having a first surface and a second surface opposite to the first surface of the second die pad, the first surface of the second die pad facing the first surface of the first die pad;
   a first semiconductor chip attached to the first surface of the first die pad; and
   an encapsulation material encapsulating the first semiconductor chip and portions of the first lead frame and the second lead frame, the encapsulation material having a first surface aligned with the second surface of the first die pad and a second surface aligned with the second surface of the second die pad, a hole through the encapsulation material extending from the first surface of the encapsulation material to the second surface of the encapsulation material.

6. A semiconductor device comprising:
   a first lead frame comprising a first die pad having a first surface and a second surface opposite to the first surface of the first die pad;
   a second lead frame comprising a second die pad having a first surface and a second surface opposite to the first surface of the second die pad, the first surface of the second die pad facing the first surface of the first die pad;
   a first semiconductor chip attached to the first surface of the first die pad; and
   an encapsulation material encapsulating the first semiconductor chip and portions of the first lead frame and the second lead frame, the encapsulation material having a first surface aligned with the second surface of the first die pad and a second surface aligned with the second surface of the second die pad, wherein the semiconductor device is a through-hole device.

7. The semiconductor device of claim 1, wherein the semiconductor device is a surface mount device.

8. A semiconductor device comprising:
   a first lead frame comprising a first die pad having a first surface and a second surface opposite to the first surface of the first die pad;
   a second lead frame comprising a second die pad having a first surface and a second surface opposite to the first surface of the second die pad, the first surface of the second die pad facing the first surface of the first die pad;
   a first semiconductor chip attached to the first surface of the first die pad;
   a second semiconductor chip attached to the first surface of the second die pad; and
   an encapsulation material encapsulating the first semiconductor chip and the second semiconductor chip and portions of the first lead frame and the second lead frame, the encapsulation material having a first surface aligned with the second surface of the first die pad and a second surface aligned with the second surface of the second die pad.

9. The semiconductor device of claim 8, further comprising:
   a third semiconductor chip; and
   a fourth semiconductor chip;
   wherein the first lead frame comprises a third die pad having a first surface and a second surface opposite to the first surface of the third die pad;
   wherein the second lead frame comprises a fourth die pad having a first surface and a second surface opposite to the first surface of the fourth die pad;
   wherein the third semiconductor chip is attached to the first surface of the third die pad;
   wherein the fourth semiconductor chip is attached to the first surface of the fourth die pad; and
   wherein the encapsulation material encapsulates the third semiconductor chip and the fourth semiconductor chip and wherein the first surface of the encapsulation material is aligned with the second surface of the third die pad and the second surface of the encapsulation material is aligned with the second surface of the fourth die pad.

10. The semiconductor device of claim 8, wherein the first semiconductor chip comprises a power semiconductor chip; and
wherein the second semiconductor chip comprises a logic chip.

11. The semiconductor device of claim 8, wherein the first semiconductor chip comprises a power transistor chip; and
wherein the second semiconductor chip comprises a diode chip.

12. The semiconductor device of claim 8, wherein the first semiconductor chip comprises a first power transistor chip; and
wherein the second semiconductor chip comprises a second power transistor chip.

13. The semiconductor device of claim 8, further comprising:
an interconnect board between the first semiconductor chip and the second semiconductor chip electrically coupling the first semiconductor chip to the second semiconductor chip.

14. A method to fabricate a semiconductor device, the method comprising:
attaching a first semiconductor chip to a first surface of a first die pad of a first lead frame, the first die pad having a second surface opposite to the first surface of the first die pad;
attaching a second semiconductor chip to a first surface of a second die pad of a second lead frame, the second die pad having a second surface opposite to the first surface of the second die pad;
stacking the second lead frame on the first lead frame such that the first surface of the first die pad faces the first surface of the second die pad; and
encapsulating the first semiconductor chip and the second semiconductor chip and portions of the first lead frame and the second lead frame with an encapsulation material such that the second surface of the first die pad is aligned with a first surface of the encapsulation material and the second surface of the second die pad is aligned with a second surface of the encapsulation material.

15. The method of claim 14, further comprising:
electrically coupling the second lead frame to the first lead frame.

16. The method of claim 14, further comprising:
cutting leads of the second lead frame after stacking the second lead frame on the first lead frame.

17. The method of claim 14, further comprising:
wire bonding the first semiconductor chip to leads of the first lead frame; and
wire bonding the second semiconductor chip to leads of the second lead frame.

18. The method of claim 14, further comprising:
electrically coupling the first semiconductor chip to the second semiconductor chip.

19. The method of claim 14, further comprising:
attaching a first heat sink to the second surface of the first die pad and the first surface of the encapsulation material; and
attaching a second heat sink to the second surface of the second die pad and the second surface of the encapsulation material.

20. The semiconductor device of claim 1, the first lead frame including a first lead extending directly from the first die pad, and the second lead frame being directly electrically connected to the first die pad by a lead portion extending from the second die pad and directly connecting to the first lead.

* * * * *